(12) United States Patent
Fujita et al.

(10) Patent No.: US 11,763,993 B2
(45) Date of Patent: Sep. 19, 2023

(54) CERAMIC ELECTRONIC DEVICE AND MOUNTING SUBSTRATE

(71) Applicant: TAIYO YUDEN CO., LTD., Tokyo (JP)

(72) Inventors: Kimio Fujita, Tokyo (JP); Yasutomo Suga, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 260 days.

(21) Appl. No.: 17/107,659

(22) Filed: Nov. 30, 2020

(65) Prior Publication Data

US 2021/0202173 A1 Jul. 1, 2021

(30) Foreign Application Priority Data

Dec. 25, 2019 (JP) ................. 2019-234147

(51) Int. Cl.
*H01G 4/248* (2006.01)
*H01G 4/232* (2006.01)
*H05K 1/11* (2006.01)
*H01G 4/30* (2006.01)

(52) U.S. Cl.
CPC ............ *H01G 4/248* (2013.01); *H01G 4/232* (2013.01); *H01G 4/30* (2013.01); *H05K 1/111* (2013.01); *H05K 2201/10015* (2013.01)

(58) Field of Classification Search
CPC ................................................ H01G 4/248
USPC ........................................................ 174/260
See application file for complete search history.

(56) References Cited

U.S. PATENT DOCUMENTS

| | | | | |
|---|---|---|---|---|
| 2010/0103586 A1* | 4/2010 | Tang | ...................... | H01G 4/232 361/301.4 |
| 2014/0374912 A1* | 12/2014 | Knights | .................. | H01L 24/16 257/769 |
| 2019/0027312 A1* | 1/2019 | Muramatsu | .............. | H01G 4/12 |
| 2020/0357737 A1* | 11/2020 | Arvin | ...................... | H01L 24/09 |

FOREIGN PATENT DOCUMENTS

JP 5534566 B2 5/2014
JP 2019-24077 A 2/2019

* cited by examiner

*Primary Examiner* — Stanley Tso
(74) *Attorney, Agent, or Firm* — Stein IP, LLC (57) ABSTRACT

A ceramic electronic device includes a multilayer chip having dielectric layers and internal electrode layers and having a first main face and a second main face that have a rectangular shape in a planar view, external electrodes each of which extends from the first main face to the second main face at each of two diagonal corners of the rectangular shape, the external electrodes being spaced from each other, each of the external electrodes being connected to a part of the internal electrode layers, and a conductor that is provided on the first main face, the second main face or both of the first main face and the second main face, is spaced from the external electrodes, and is provided in a region which includes an intersection point of perpendicular bisectors of two adjacent sides of the rectangular shape.

17 Claims, 12 Drawing Sheets

CERAMIC ELECTRONIC DEVICE AND MOUNTING SUBSTRATE

CROSS-REFERENCE TO RELATED APPLICATION

This application is based upon and claims the benefit of priority of the prior Japanese Patent Application No. 2019-234147, filed on Dec. 25, 2019, the entire contents of which are incorporated herein by reference.

FIELD

A certain aspect of the present invention relates to a ceramic electronic device and a mounting substrate.

BACKGROUND

Recently, electronic devices such as mobile phones are downsized and thinned. Therefore, substrates mounted on the electronic devices are downsized and thinned. And, ceramic electronic devices such as multilayer ceramic capacitors mounted on a substrate is downsized and thinned (for example, see Japanese Patent Application Publication No. 2019-24077).

SUMMARY OF THE INVENTION

When a ceramic electronic device is mounted, crack may occur in the ceramic electronic device because of impact during absorbing and holding an upper part of the ceramic electronic device by using a mounter. And, an insulation resistance (IR) value may be reduced. And so, it is thought that strength is improved by adjusting a length of an electrode, the number of cover, or the number of internal electrode layers, and the crack is suppressed. However, the crack is not sufficiently suppressed.

According to an aspect of the present invention, there is provided a ceramic electronic device including: a multilayer chip having a plurality of dielectric layers and a plurality of internal electrode layers that are stacked, and having a first main face and a second main face that face each other in a stacking direction and have a rectangular shape in a planar view; a plurality of external electrodes each of which extends from the first main face to the second main face at each of two diagonal corners of the rectangular shape, the plurality of external electrodes being spaced from each other, each of the plurality of external electrodes being connected to a part of the plurality of internal electrode layers; and a conductor that is provided on the first main face, the second main face or both of the first main face and the second main face, is spaced from the plurality of external electrodes, and is provided in a region which includes an intersection point of perpendicular bisectors of two adjacent sides of the rectangular shape.

According to another aspect of the present invention, there is provided a ceramic electronic device including: a multilayer chip having a plurality of dielectric layers and a plurality of internal electrode layers that are stacked, and having a first main face and a second main face that face each other in a stacking direction and have a rectangular shape in a planar view; two external electrodes each of which extends from the first main face to the second main face at each of two diagonal corners of the rectangular shape, the two external electrodes being spaced from each other, each of the two external electrodes being connected to a part of the plurality of internal electrode layers; and a conductor that is provided on the first main face, the second main face or both of the first main face and the second main face, is spaced from the two external electrodes, and is provided in a region which includes an intersection point of perpendicular bisectors of two adjacent sides of the rectangular shape, wherein the conductor extends from a first diagonal corner of other two diagonal corners to a second diagonal corner of the other two diagonal corner on the first main face, the second main face, or both of the first main face and the second main face.

According to another aspect of the present invention, there is provided a mounting substrate including; a substrate; and the above-mentioned ceramic electronic device and is mounted on the substrate, wherein each of the plurality of external electrodes and the conductor is connected to a land provided on the substrate.

DETAILED DESCRIPTION

A description will be given of an embodiment with reference to the accompanying drawings.

First Embodiment

Figure 1:
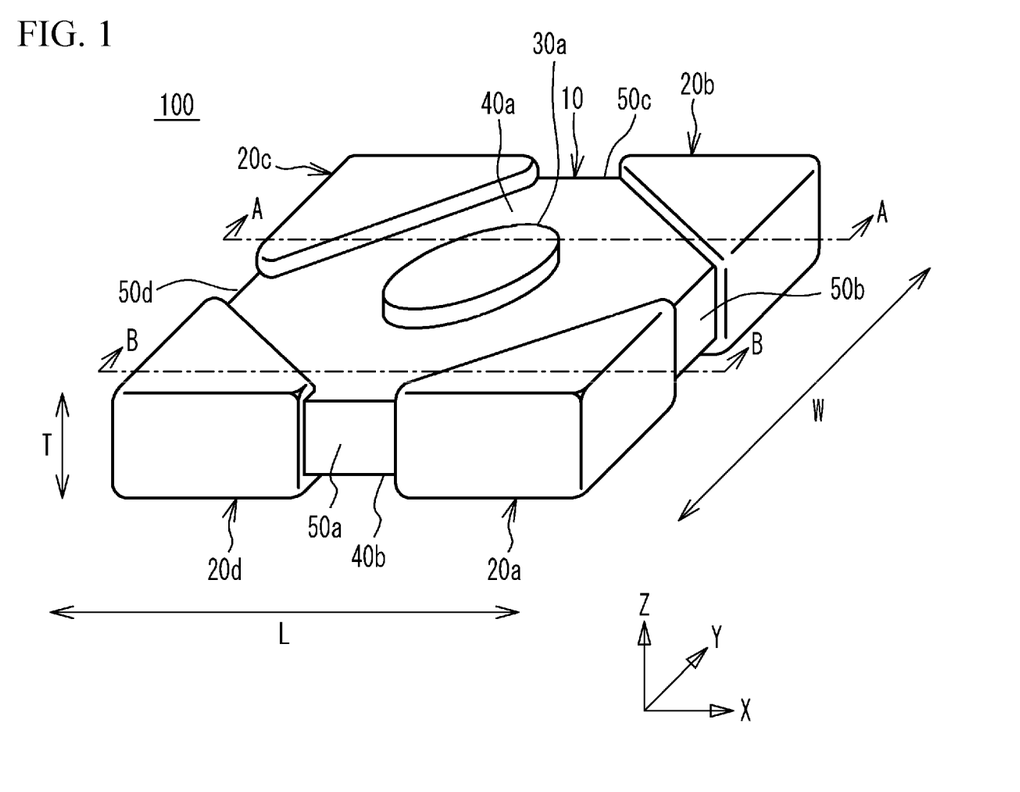
FIG. 1 illustrates an oblique view of a multilayer ceramic capacitor.
Figure 2:
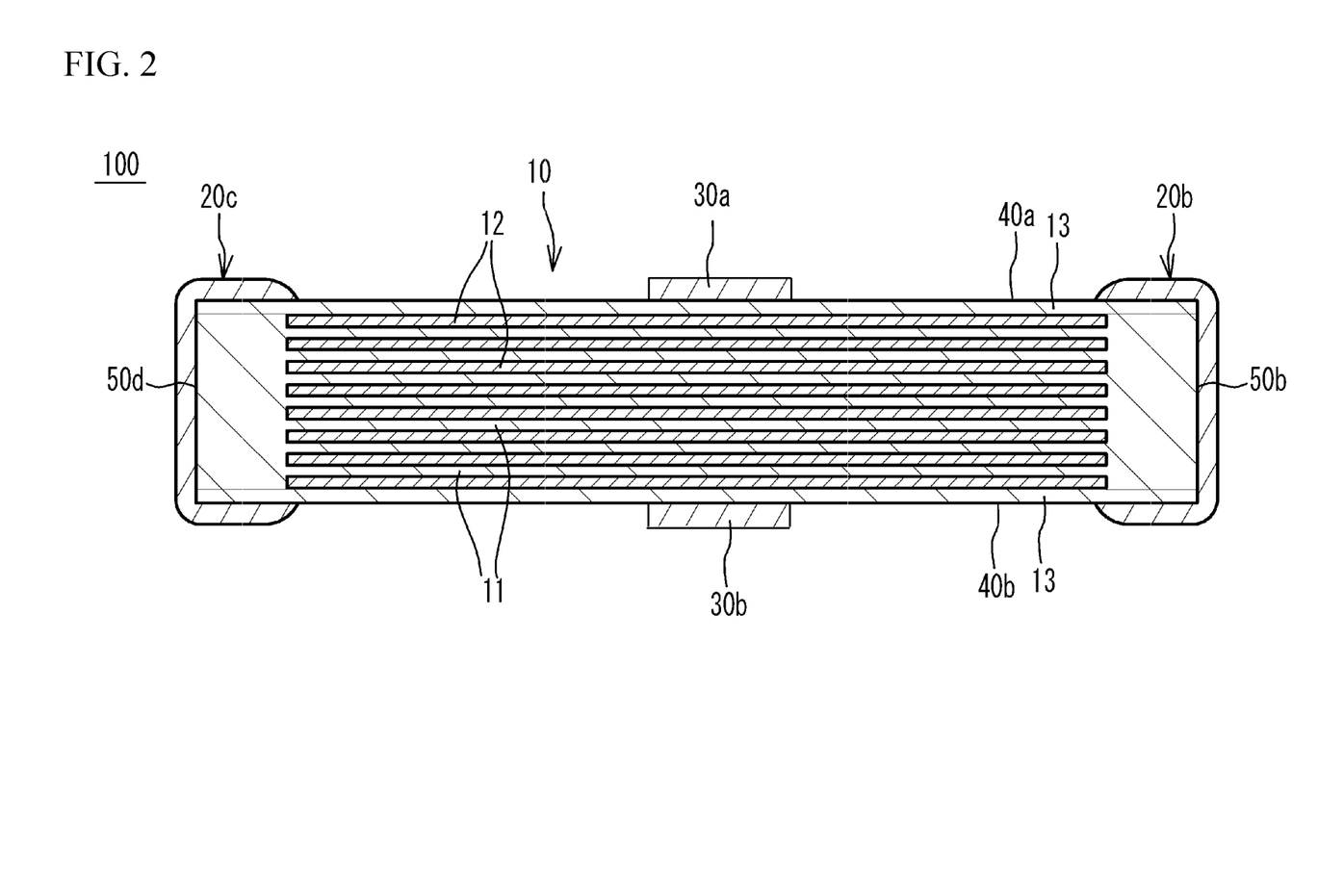
FIG. 2 illustrates a cross sectional view taken along a line A-A of FIG. 1.
Figure 3:
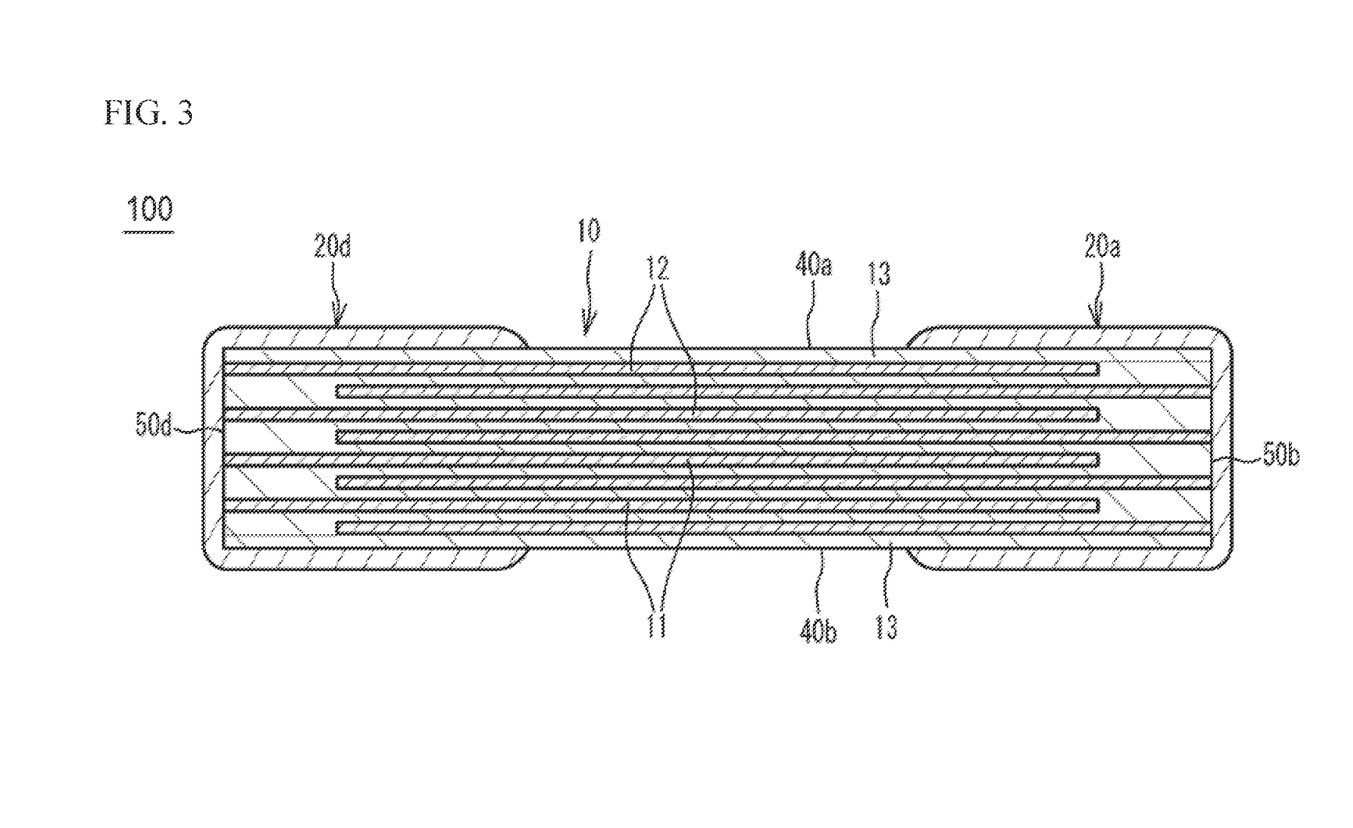
FIG. 3 illustrates a cross sectional view taken along a line B-B of FIG. 1.

FIG. 1 illustrates an oblique view of a multilayer ceramic capacitor 100 in accordance with a first embodiment. FIG. 2 illustrates a cross sectional view taken along a line A-A of FIG. 1. FIG. 3 illustrates a cross sectional view taken along a line B-B of FIG. 1. As illustrated in FIG. 1 to FIG. 3, the multilayer ceramic capacitor 100 has a multilayer chip 10 having a board shape, four external electrodes 20a to 20d, and two dummy electrodes 30a and 30b.

As illustrated in FIG. 2 and FIG. 3, the multilayer chip 10 has a structure in which each of dielectric layers 11 having s ceramic material acting as a dielectric substance and each of internal electrode layers 12 are alternately stacked. In FIG. 3, edges of the internal electrode layers 12 are alternately exposed to the external electrode 20a and the external electrode 20d. Thus, each of the internal electrode layers 12 is alternately electrically connected to each of the external electrode 20a and the external electrode 20d. The internal electrode layer 12 connected to the external electrode 20a is also connected to the external electrode 20c. The internal electrode layer 12 connected to the external electrode 20d is also connected to the external electrode 20b. Therefore, the external electrode 20a and the external electrode 20c have the same pole. The external electrode 20b and the external electrode 20d have the same pole. In a multilayer structure of the dielectric layers 11 and the internal electrode layers 12, outermost layers in the stacking direction are two of the internal electrode layers 12. Cover layers 13 covers an upper face and a lower face of the multilayer structure. A main component of the cover layers 13 is a ceramic material. For example, the main component of the cover layer 13 is the same as that of the ceramic material of the dielectric layers 11.

The multilayer chip 10 has an upper face 40a and a lower face 40b in the stacking direction which are two main faces. The upper face 40a faces the lower face 40b. The multilayer chip 10 has side faces 50a to 50d which are four faces other than the upper face 40a and the lower face 40b. The side face 50a faces the side face 50c. The side face 50b faces the side face 50d.

The stacking direction of the dielectric layers 11 and the internal electrode layers 12 is a Z-axis. An X-axis is perpendicular to the Z-axis and is parallel with the side faces 50a and 50c. A Y-axis is perpendicular to the Z-axis and is parallel with the side faces 50b and 50d. The X-axis, the Y-axis and the Z-axis are perpendicular to each other. A length of the multilayer ceramic capacitor 100 in the X-axis direction is a length L. A width of the multilayer ceramic capacitor 100 in the Y-axis direction is a width W. A thickness of the multilayer ceramic capacitor 100 in the Z-axis direction is a thickness T. In a planar view viewed along the Z-axis direction, the multilayer chip 10 has a rectangular shape. The length L and the width W are two sides next to each other in the rectangular shape.

In a planar view which is viewed along the Z-axis direction, the upper face 40a and the lower face 40b have a rectangular shape. The thickness T of the multilayer ceramic capacitor 100 in the stacking direction is, for example, 150 µm or less, 120 µm or less, 90 µm or less, or 75 µm or less. The thickness of the multilayer chip 10 in the stacking direction is, for example, 90 µm or less, 70 µm or less, 50 µm or less. A minimum thickness of the multilayer chip 10 is, for example, 30 µm. When the thickness of the multilayer chip 10 is 30 µm or more and 50 µm or less, the thickness is sufficiently small and the multilayer ceramic capacitor 100 becomes a device having sufficiently large transverse intensity. The length L is, for example, 1.7 mm, 1.2 mm, 0.6 mm or the like. The width W is, for example, 1.7 mm, 1.2 mm, 0.6 mm or the like. A ratio of one of the length L and the width W with respect to the thickness T is 54:46 to 95:5.

The external electrode 20a extends to the upper face 40a, the lower face 40b and the side faces 50a and 50b, on a corner portion formed by the upper face 40a, the lower face 40b and the side faces 50a and 50b. The external electrode 20b extends to the upper face 40a, the lower face 40b and the side faces 50b and 50c, on a corner portion formed by the upper face 40a, the lower face 40b and the side faces 50b and 50c. The external electrode 20c extends to the upper face 40a, the lower face 40b and the side faces 50c and 50d, on a corner portion formed by the upper face 40a, the lower face 40b and the side faces 50c and 50d. The external electrode 20d extends to the upper face 40a, the lower face 40b and the side faces 50d and 50a, on a corner portion formed by the upper face 40a, the lower face 40b and the side faces 50d and 50a. The external electrodes 20a to 20d are spaced from each other. In the embodiment, the external electrodes 20a to 20d have a triangle shape in the planar view viewed along the Z-axis direction.

The dummy electrode 30a is provided on a center of the upper face 40a. The dummy electrode 30a is spaced from each of the external electrodes 20a to 20d. The dummy electrode 30b is provided on a center of the lower face 40b. The dummy electrode 30b is spaced from each of the external electrodes 20a to 20d.

Figure 4:
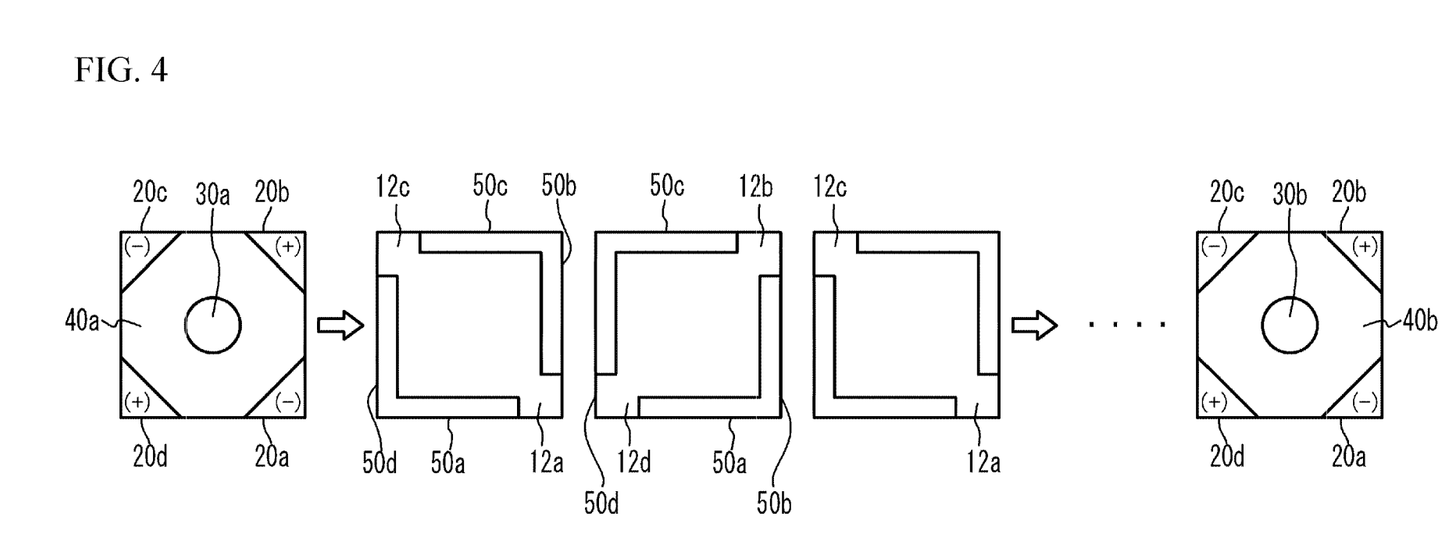
FIG. 4 illustrates a multilayer structure of internal electrode layers.

FIG. 4 illustrates a multilayer structure of the internal electrode layers 12. The leftmost figure of FIG. 4 is a plan view of the upper face 40a and includes the external electrodes 20a to 20d and the dummy electrode 30a. The rightmost figure of FIG. 4 is a perspective view of the lower face 40b and includes the external electrodes 20a to 20d and the dummy electrode 30b. Between the leftmost figure and the rightmost figure, each figure from the internal electrode layer 12 on the side of the upper face 40a to the internal electrode layer 12 on the side of the lower face 40b is illustrated, from left to right.

As illustrated in FIG. 4, in the multilayer chip 10, each of first internal electrode layers 12 and each of second internal electrode layers 12 are alternately stacked through each of the dielectric layers 11. The first internal electrode layer 12 has an extraction portion 12a exposed to a corner formed by the side face 50a and the side face 50b and an extraction portion 12c exposed to a corner formed by the side face 50c and the side face 50d. The second internal electrode layer 12 has an extraction portion 12b exposed to a corner formed by the side face 50b and the side face 50c and an extraction portion 12d exposed to a corner formed by the side face 50d and the side face 50a. In the first internal electrode layer 12, only the extraction portion 12a and the extraction portion 12c are exposed to the side faces of the multilayer chip 10. In the second internal electrode layer 12, only the extraction portions 12b and 12d are exposed to the side faces of the multilayer chip 10.

With the structure, the external electrode 20a and the external electrode 20c act as electrodes of a first polarity. The external electrode 20b and the external electrode 20d act as electrodes of a second polarity. The dummy electrodes 30a and 30b are spaced from the external electrodes 20a to 20d. Therefore, the dummy electrodes 30a and 30b are not connected to the internal electrode layers 12. Accordingly, the dummy electrodes 30a and 30b does not act as electrodes contributing to the capacity of the multilayer ceramic capacitor 100.

A main component of the internal electrode layers 12 is a base metal such as nickel (Ni), copper (Cu), tin (Sn) or the like. The internal electrode layers 12 may be made of a noble metal such as platinum (Pt), palladium (Pd), silver (Ag), gold (Au) or alloy thereof. The dielectric layers 11 are mainly composed of a ceramic material that is expressed by a general formula $ABO_3$ and has a perovskite structure. The perovskite structure includes $ABO_{3-\alpha}$ having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure.

Figure 5:
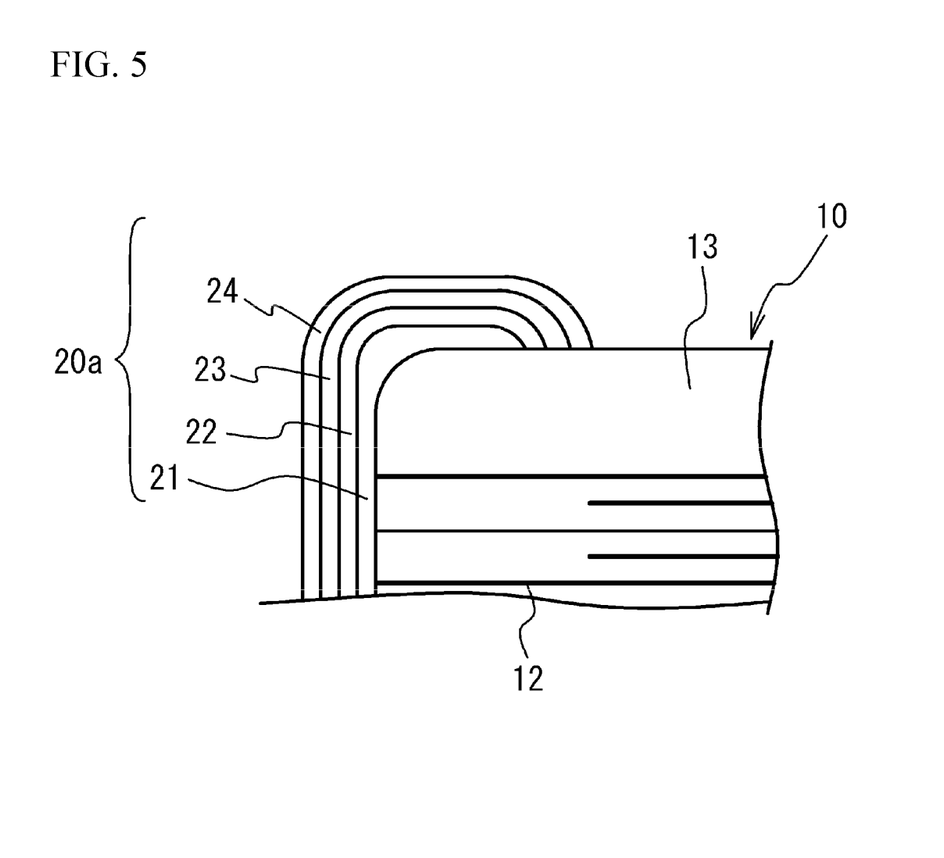
FIG. 5 illustrates a cross sectional view of an external electrode which is a partial cross sectional view taken along a line B-B of FIG. 1.

FIG. 5 illustrates a cross sectional view of the external electrode 20a. FIG. 5 illustrates a partial cross sectional view taken along a line B-B of FIG. 1. In FIG. 5, hatching indicating a cross section is omitted. As illustrated in FIG. 5, the external electrode 20a has a structure in which a plated layer is formed on a base layer. For example, the external electrode 20a has a structure in which a Cu-plated layer 22, a Ni-plated layer 23 and a Sn-plated layer 24 are formed on a base layer 21. The base layer 21 is, for example, a sputtered film. In FIG. 5, the external electrode 20a is illustrated. The external electrodes 20b to 20d have the same structure as that of the external electrode 20a. The dummy electrodes 30a and 30b have the same structure as that of external electrodes 20a-20d. Therefore, the dummy electrodes 30a and 30b are conductors.

Figure 6A:
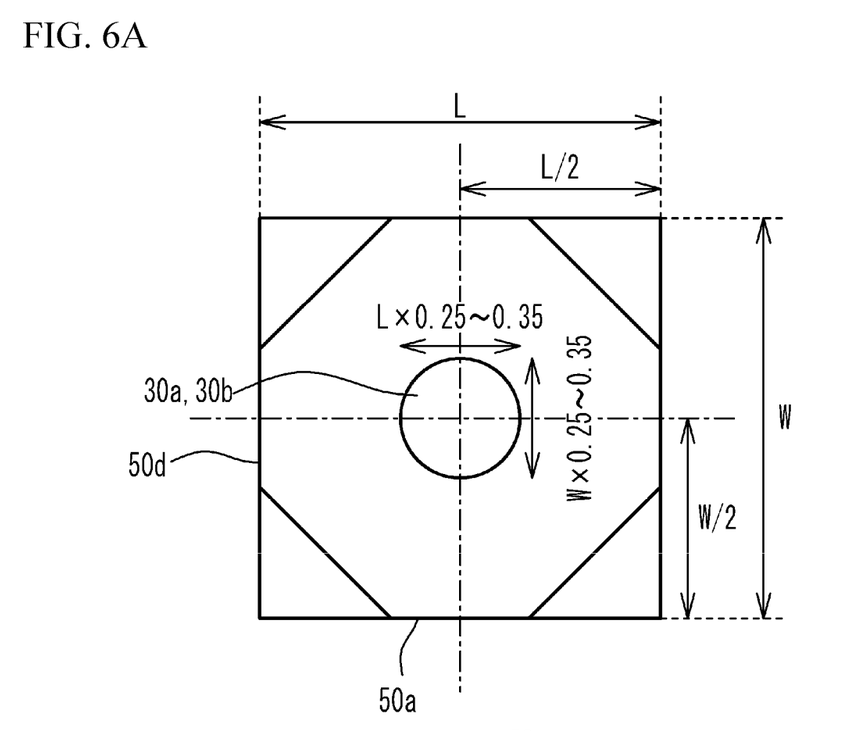
FIG. 6A and FIG. 6B illustrate shapes of dummy electrodes.
Figure 6B:
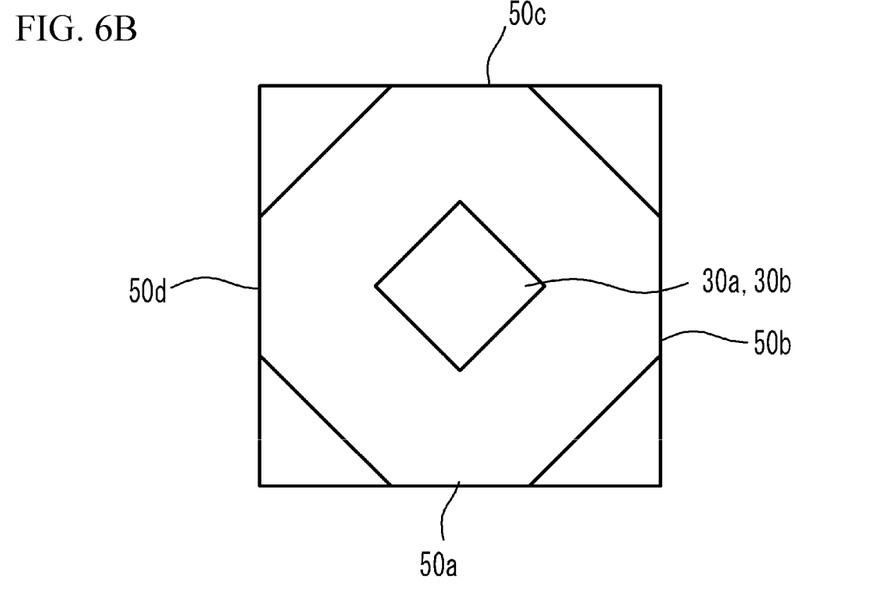

As illustrated in FIG. 6A, a ratio L/W is, for example, 0.90 or more and 1.10 or less. In a planar view viewed along the Z-axis direction, the dummy electrodes 30a and 30b have a region including an intersection point of diagonal lines of the multilayer chip 10. In other words, the dummy electrodes 30a and 30b have a region including an intersection point of perpendicular bisectors of two adjacent sides of the multilayer chip 10, in a planar view viewed along the Z-axis direction. When the multilayer chip 10 has a length L and a width W, the dummy electrodes 30a and 30b are located within L×0.25 or more and L×0.35 or less from the side face 50d in the direction of the length L and within W×0.25 or ore and W×0.35 or less from the side face 50a in the direction of the Width W. The shape of the dummy electrodes 30a and 30b is not limited. For example, as illustrated in FIG. 6B, the dummy electrodes 30a and 30b may have a rectangular or a square shape. In the Z-axis direction, the dummy electrodes 30a and 30b are substantially the same as the thickness of the external electrodes 20a to 20d (extend from the first and second main surfaces 40a, 40b the same distance).

Figure 7A:
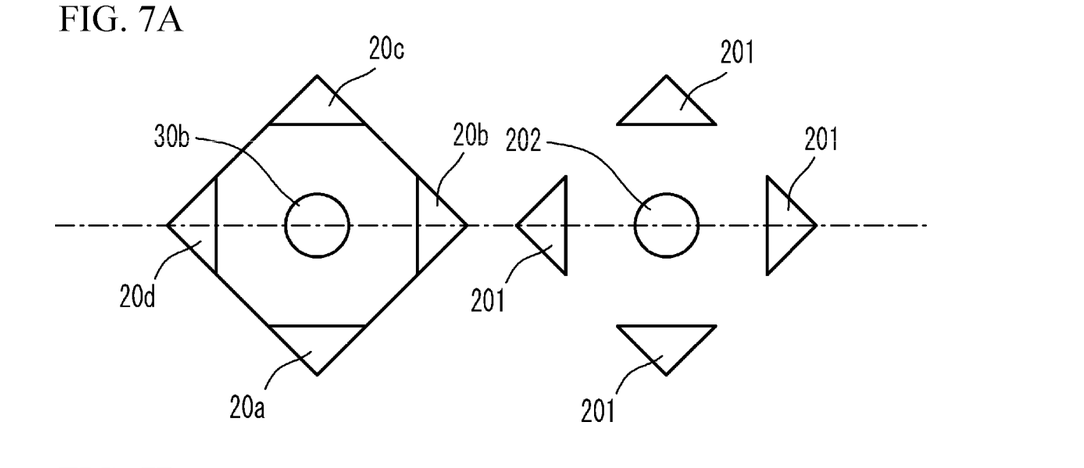
FIG. 7A to FIG. 7C illustrate a case where a multilayer ceramic capacitor is mounted on a substrate.

FIG. 7A to FIG. 7C illustrate a case where the multilayer ceramic capacitor 100 is mounted on a substrate 200. A left figure of FIG. 7A is a planar view of the multilayer ceramic capacitor 100. A right figure of FIG. 7A is a land provided on the substrate 200. As illustrated in FIG. 7A, a land 201 substantially having the same shape as those of the external electrodes 20a to 20d in a planar view and a land 202 substantially having the same shape as that of the dummy electrode 30b in a planar view are provided. The multilayer ceramic capacitor 100 is mounted on the substrate 200 so that the lower face 40b faces the substrate 200.

Figure 7B:
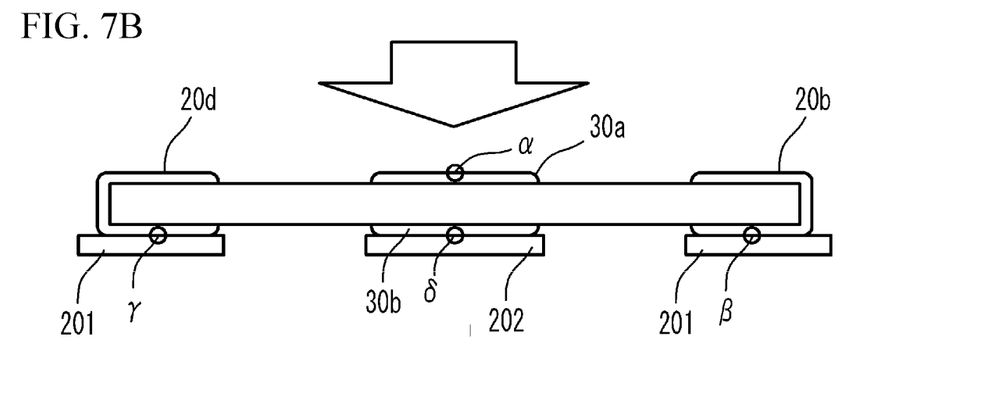

The center portion of the upper face 40a (the location of the dummy electrode 30a) is sucked and held. Thus, the multilayer ceramic capacitor 100 is mounted on the substrate 200. In this case, as illustrated in FIG. 7B, in a direction along one dashed line of FIG. 7A, three-point bending of a point α of the upper face 40a, a point β of the external electrode 20b, a point γ of the external electrode 20d may occur. However, the external electrodes 20b and 20d are mounted on the land 201. The dummy electrode 30b is mounted on the land 202. That is, the dummy electrode 30b is supported by the land at a point δ together with the external electrodes 20b and 20d. In the structure, the dummy electrode 30b is also supported by the land 202. Therefore, withstand strength against the three-point bending is improved. It is therefore possible to suppress the crack of the multilayer ceramic capacitor 100.

Figure 7C:
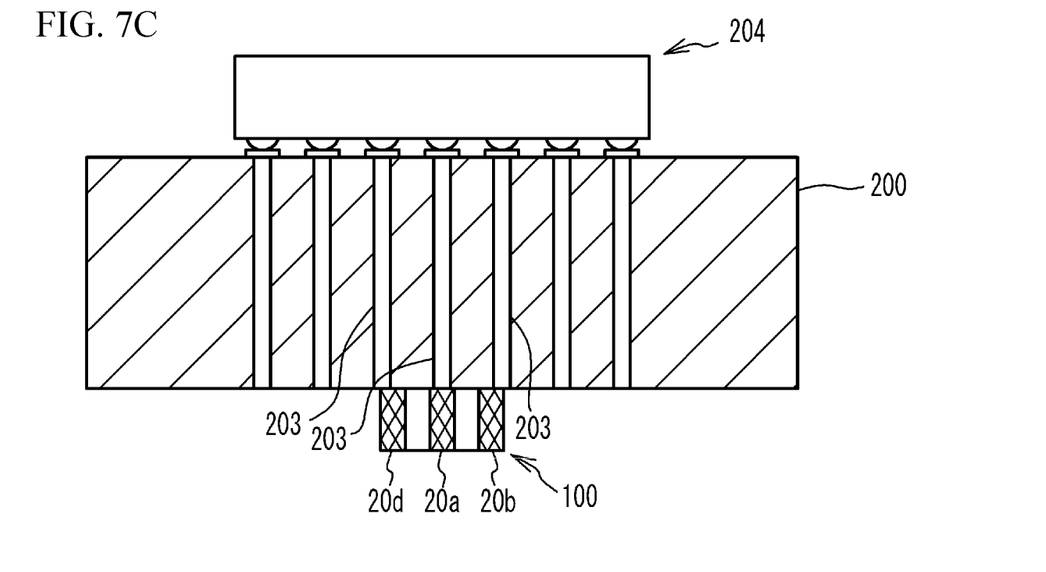

As illustrated in FIG. 7C, the substrate 200 has a plurality of through-hole wirings 203. An IC chip 204 is provided on a face of the substrate 200 which is opposite to the multilayer ceramic capacitor 100. Each of the plurality of through-hole wirings 203 is connected with anyone of the external electrodes 20a to 20d through a BGA (Ball Grid Array) or the like. Each of the plurality of through-hole wirings 203 is connected to the IC chip 204. In FIG. 7C, hatching of the through-hole wirings 203 is omitted.

In the embodiment, in the planar view of the multilayer chip 10 viewed along the Z-axis direction, the external electrodes are provided on the four corners. However, the structure is not limited. For example, in the planar view of the multilayer chip 10 viewed along the Z-axis direction, at least two electrodes may be provided on the two diagonal corners. In the embodiment, the dummy electrodes are provided on both of the upper face 40a and the lower face 40b. However, the structure is not limited. For example, the dummy electrode may be provided on the upper face 40a, the lower face 40b, or both of the upper face 40a and the lower face 40b. In this case, the face on which the dummy electrode is provided acts as a mounting face.

Second Embodiment

Figure 8:
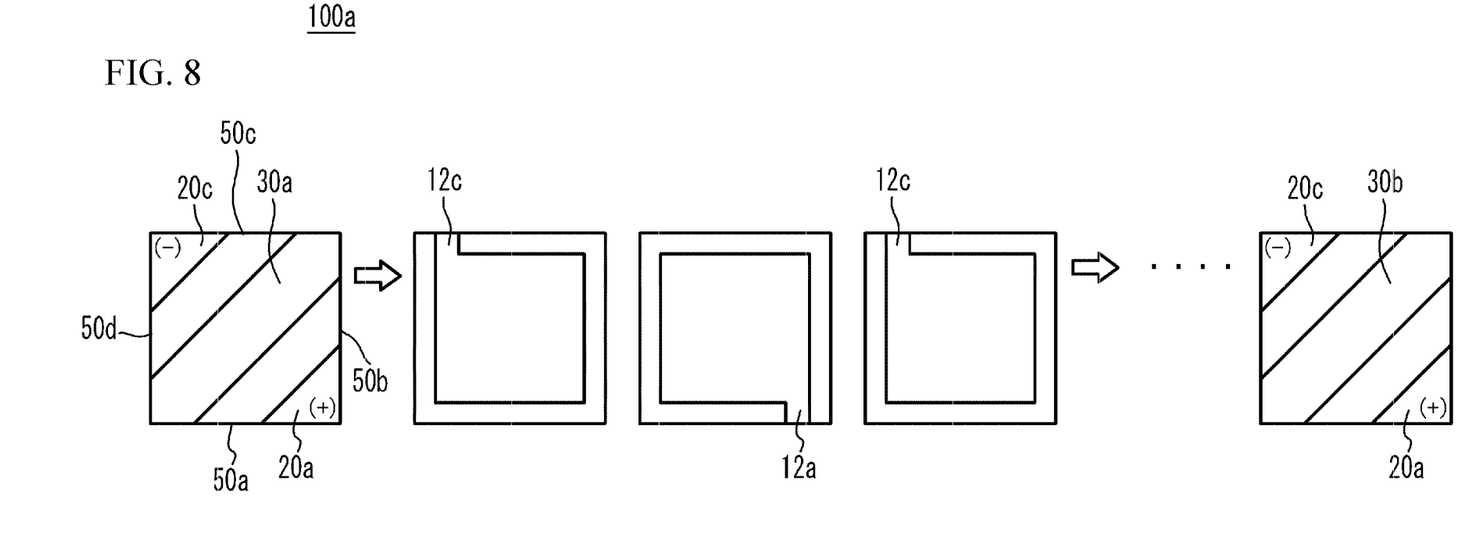
FIG. 8 illustrates a multilayer structure of a multilayer ceramic capacitor in accordance with a second embodiment.

FIG. 8 illustrates a multilayer structure of a multilayer ceramic capacitor 100a in accordance with a second embodiment. A leftmost figure of FIG. 8 is a plan view of the upper face 40a. As illustrated in the leftmost figure of FIG. 8, the multilayer ceramic capacitor 100a has neither the external electrode 20b nor the external electrode 20d. The dummy electrode 30a extends to the corner formed by the side face 50b and the side face 50c and extends to the corner formed by the side face 50d and the side face 50a. A rightmost figure of FIG. 8 is a perspective view of the lower face 40b. The dummy electrode 30b extends to the corner formed by the side face 50b and the side face 50c and extends to the corner formed by the side face 50d and the side face 50a. Between the leftmost figure and the rightmost figure of FIG. 8, each figure from the internal electrode layer 12 on the side of the upper face 40a to the internal electrode layer 12 on the side of the lower face 40b is illustrated, from left to right.

As illustrated in FIG. 8, the first internal electrode layer 12 having the extraction portion 12a exposed to the corner formed by the side face 50a and the side face 50b, and the second internal electrode layer 12 having the extraction portion 12c exposed to the corner formed by the side face 50b and the side face 50c are alternately stacked through the dielectric layer 11, in the multilayer chip 10. In the first internal electrode layer 12, only the extraction portion 12a is exposed to the side face of the multilayer chip 10. In the second internal electrode layer 12, only the extraction portion 12c is exposed to the side face of the multilayer chip 10.

In the embodiment, the dummy electrode 30b is mounted on the land of the substrate 200, together with the external electrodes 20a and 20c. That is, the dummy electrode 30b is supported by the land, together with the external electrode 20a and 20c. In the structure, the dummy electrode 30b is supported by the land. Therefore, resistance against the three-point bending is improved. The dummy electrodes 30a and 30b extend from one of diagonal corners to the other. Therefore, strength is improved. It is therefore possible to suppress the crack of the multilayer ceramic capacitor 100a.

Third Embodiment

Figure 9:
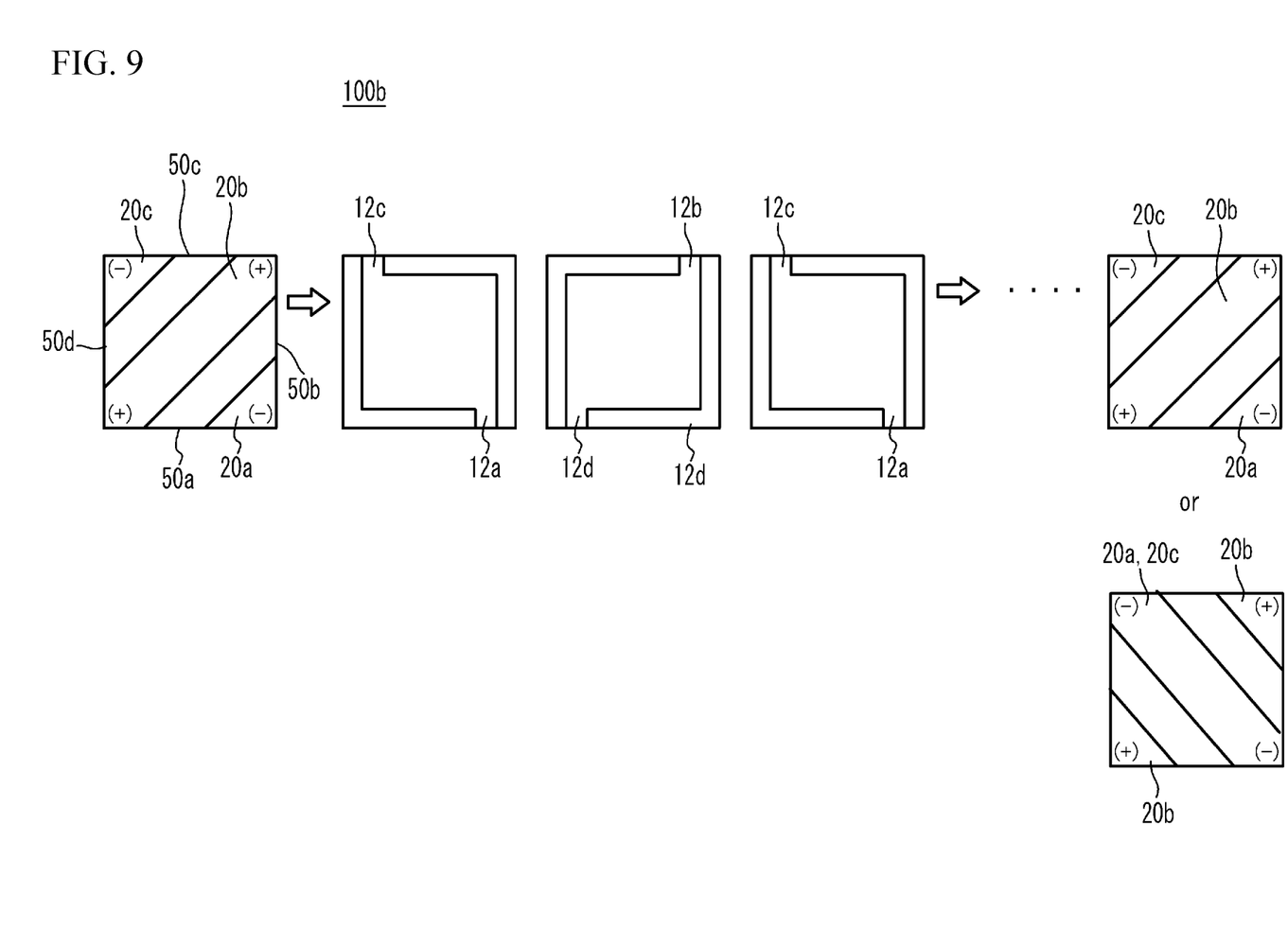
FIG. 9 illustrates a multilayer structure of a multilayer ceramic capacitor in accordance with a third embodiment.

FIG. 9 illustrates a multilayer structure of a multilayer ceramic capacitor 100b in accordance with a third embodiment. A leftmost figure of FIG. 9 is an example of the upper face 40a. A rightmost figure of FIG. 9 is a perspective view of the lower face 40b. As illustrated in the leftmost figure and the rightmost figure of FIG. 9, in this embodiment, the multilayer ceramic capacitor 100b has none of the external electrode 20d and the dummy electrode 30a and 30b.

In the embodiment, the external electrode 20b extends from the corner formed by the side face 50b and the side face 50c to the corner formed by the side face 50d and the side face 50a. The external electrode 20b of the upper face 40a and the external electrode 20b of the lower face 40b are connected to each other.

As illustrated in FIG. 9, the first internal electrode layer 12 having the extraction portion 12a exposed to the corner formed by the side face 50a and the side face 50b and the extraction portion 12c exposed to the corner formed by the side face 50c and the side face 50d, and the second internal electrode layer 12 having the extraction portion 12b exposed to the corner formed by the side face 50b and the side face 50c and the extraction portion 12d exposed to the corner formed by the side face 50d and the side face 50a are alternately stacked through the dielectric layer 11. In the first internal electrode layer 12, only the extraction portions 12a and 12c are exposed to the side face of the multilayer chip 10. In the second internal electrode layer 12, only the extraction portions 12b and 12d are exposed to the side face of the multilayer chip 10.

In the embodiment, the external electrode 20b is mounted on the center land of the substrate 200, together with the external electrodes 20a and 20c. That is, the external electrode 20b is supported by the center land together with the external electrodes 20a and 20c. In the structure, resistance against the three-point bending is improved. The external electrode 20b extends from one of the two diagonal corners to the other. Therefore, the strength is improved. It is therefore possible to suppress the crack of the multilayer ceramic capacitor 100b.

As illustrated in the rightmost lower figure of FIG. 9, in the planar view viewed along the Z-axis direction, the external electrodes extending from one of the two diagonal corners to the other on both of the upper face 40a and the lower face 40b may intersect with each other. In this case, the strength may be improved by the intersection.

Figure 10:
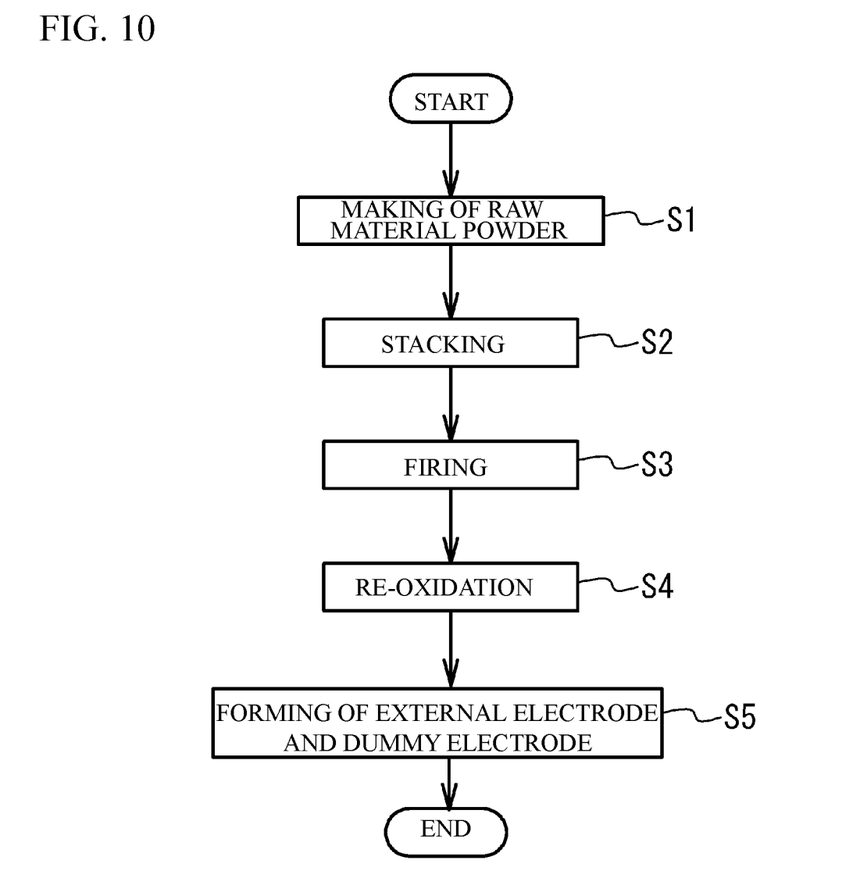
FIG. 10 illustrates a flow of a manufacturing method of a multilayer ceramic capacitor.

Next, a description will be given of a manufacturing method of the multilayer ceramic capacitor 100. FIG. 10 illustrates the flow of the manufacturing methods of the multilayer ceramic capacitors 100, 100a and 100b.

(Making process of raw material powder) A dielectric material for forming the dielectric layers 11 is prepared. The dielectric material includes a main component ceramic of the dielectric layers 11. Generally, the A site element and the B site element are included in the dielectric layers 11 in a sintered phase of grains of $ABO_3$. For example, $BaTiO_3$ is a tetragonal compound having a perovskite structure and has a high dielectric constant. Generally, $BaTiO_3$ is obtained by reacting a titanium material such as titanium dioxide with a barium material such as barium carbonate and synthesizing barium titanate. Various methods can be used as a synthesizing method of the ceramic structuring the dielectric layers 11. For example, a solid-phase method, a sol-gel method, a hydrothermal method or the like can be used. The embodiment may use any of these methods.

Additive compound may be added to the obtained ceramic powder, in accordance with purposes. The additive compound may be an oxide of Mg (magnesium), Mn (manganese), V (vanadium), Cr (chromium) or a rare earth element (Y (yttrium), Sm (samarium), Eu (europium), Gd (gadolinium), Tb (terbium), Dy (dysprosium), Ho (holmium), Er (erbium), Tm (thulium) and Yb (ytterbium), or an oxide of Co (cobalt), Ni, Li (lithium), B (boron), Na (sodium), K (potassium) and Si (silicon), or glass.

In the embodiment, it is preferable that ceramic particles structuring the dielectric layer 11 are mixed with compound including additives and are calcined in a temperature range from 820 degrees C. to 1150 degrees C. Next, the resulting ceramic particles are wet-blended with additives, are dried and crushed. Thus, ceramic powder is obtained. It is preferable that an average particle diameter of the ceramic powder is 50 nm to 300 nm from a viewpoint of reduction of the thickness of the dielectric layers 11. The grain diameter may be adjusted by crushing the resulting ceramic powder as needed. Alternatively, the grain diameter of the resulting ceramic power may be adjusted by combining the crushing and classifying.

(Stacking process) Next, a binder such as polyvinyl butyral (PVB) resin, an organic solvent such as ethanol or toluene, and a plasticizer are added to the resulting dielectric material and wet-blended. With use of the resulting slurry, a dielectric green sheet is printed on a base material by, for example, a die coater method or a doctor blade method, and then dried.

Next, metal conductive paste for forming an internal electrode is applied to the surface of the dielectric green sheet by screen printing or gravure printing. The metal conductive paste includes an organic binder. Thus, a pattern for forming an internal electrode layer is provided. As co-materials, ceramic particles are added to the metal conductive paste. A main component of the ceramic particles is not limited. However, it is preferable that the main component of the ceramic particles is the same as that of the dielectric layer 11. Each of the patterns for forming an internal electrode has each shape of FIG. 4, FIG. 8, FIG. 9, or the like.

Then, the dielectric green sheets are alternately stacked while the base material is peeled. For example, a total number of the staked dielectric green sheets is 100 to 500. After that, a cover sheet to be the cover layer 13 is cramped on the multilayer structure of the dielectric green sheets. And another cover sheet to be the cover layer 13 is cramped under the multilayer structure. Thus, a ceramic multilayer structure is obtained. After that, the binder is removed from the ceramic multilayer structure (for example, 1.0 mm×0.5 mm) in $N_2$ atmosphere of 250 degrees C. to 500 degrees C.

(Firing process) The resulting ceramic multilayer structure is fired for 10 minutes to 2 hours in a reductive atmosphere having an oxygen partial pressure of $10^{-7}$ to $10^{-10}$ atm in a temperature range of 1100 degrees C. to 1300 degrees C. In this manner, each compound is sintered. And each grain grows. Thus, the multilayer ceramic capacitor 100 is obtained.

(Re-oxidation process) After that, the re-oxidation process is performed in $N_2$ gas atmosphere in a temperature range of 600 degrees C. to 1000 degrees C.

(Forming process of external electrodes and dummy electrodes) Metal paste including a metal filler, a glass frit, a binder and a solvent is applied to the regions where the external electrodes 20a to 20d and the dummy electrodes 30a and 30b are to be formed by dipping, and is dried. After that, the metal paste is fired. Thus, the base layer 21 is formed. The binder and the solvent vaporize by the firing. In the method, it is preferable that the metal filler is Cu or the like. It is preferable that the baking is performed for 3 minutes to 30 minutes in a temperature range of 700 degrees C. to 900 degrees C. It is more preferable that the baking is performed for 5 minutes to 15 minutes in a temperature range of 760 degrees C. to 840 degrees C. After that, the Cu-plated layer 22, the Ni-plated layer 23 and the Sn-plated layer 24 may be formed on the base layer 21 by plating in this order.

The base layer 21 may be fired together with the multilayer chip 10. In this case, the binder is removed from the ceramic multilayer structure in $N_2$ atmosphere of 250 degrees C. to 500 degrees C. After that, metal paste including a metal filler, a co-material, a binder and a solvent is applied on the both end faces of the ceramic multilayer structure by a dipping method or the like and is dried. After that, the metal paste is fired together with the ceramic multilayer structure. Firing condition is described in the above-mentioned firing process. After that, a re-oxidizing process may be performed in $N_2$ gas atmosphere in a temperature range of 600 degrees C. to 1000 degrees C. After that, the Cu-plated layer 22, the Ni-plated layer 23 and the Sn-plated layer 24 are formed on the base layer 21 by plating.

In the embodiments, the multilayer ceramic capacitor is described as an example of ceramic electronic devices. However, the embodiments are not limited to the multilayer ceramic capacitor. For example, the embodiments may be applied to another electronic device such as varistor or thermistor.

EXAMPLES

The multilayer ceramic capacitors in accordance with the embodiment were made and the property was measured.

Example

The multilayer ceramic capacitor 100 were made in accordance with the first embodiment. The length L of the multilayer ceramic capacitors 100 was 0.6 mm. The width W was 0.6 mm. The thickness T was 90 μm. 1000 samples were made.

Comparative Example

Figure 11A:
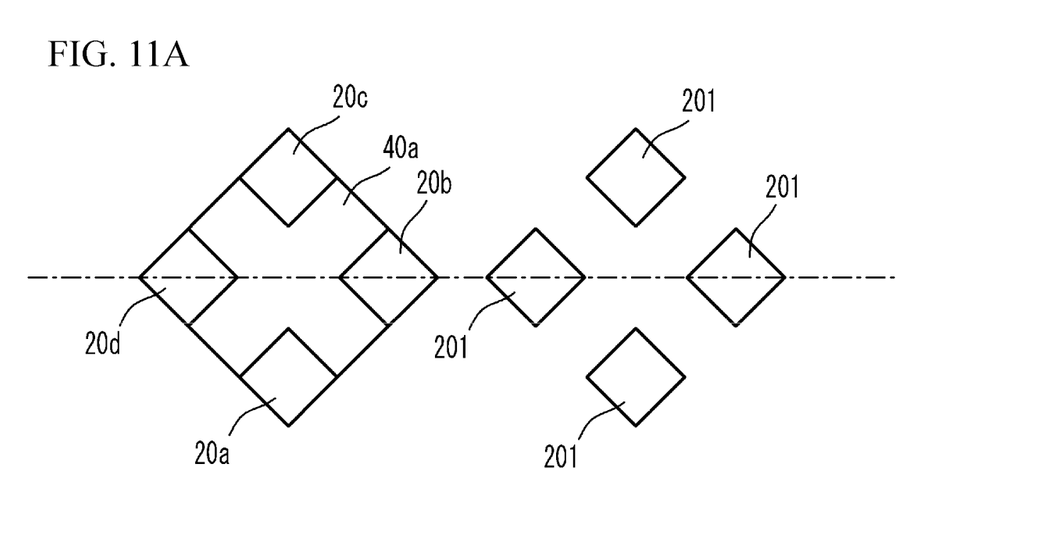
FIG. 11A and FIG. 11B illustrate a comparative example.
Figure 11B:
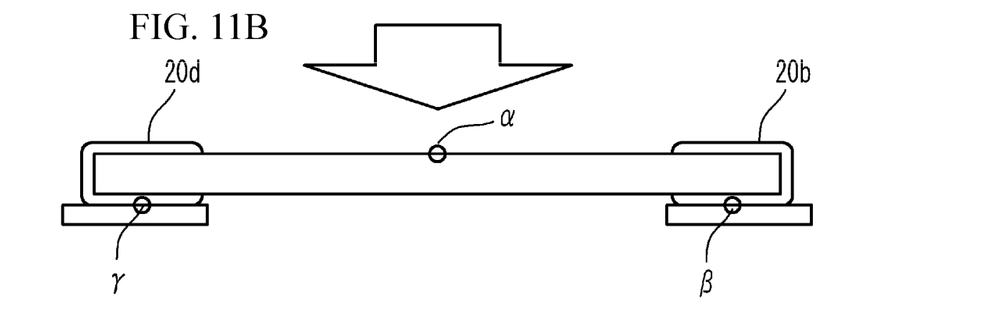

The dummy electrode was not provided in a comparative example. As illustrated in FIG. 11A and FIG. 11B, the external electrodes 20a to 20d had a square shape in a planar view viewed along the stacking direction on the upper face 40a and the lower face 40b. 1000 samples were made. FIG. 11A and FIG. 11B illustrate structures corresponding to those of FIG. 7A and FIG. 7B.

With respect to each sample of the example and the comparative example, the center of the upper face 40a was sucked and held. Thus, each sample was mounted on a substrate with use of solder. With respect to the example and the comparative example, a short rate in an IR measurement was measured in order to determine whether the solder mounting was favorable or not. In the IR measurement, when the IR was 1 MΩ or less, it is determined that short occurred. With respect to each of the example and the comparative example, a ratio of samples which were determined that short occurred with respect to the 1000 samples was calculated as the short rate.

Figure 12:
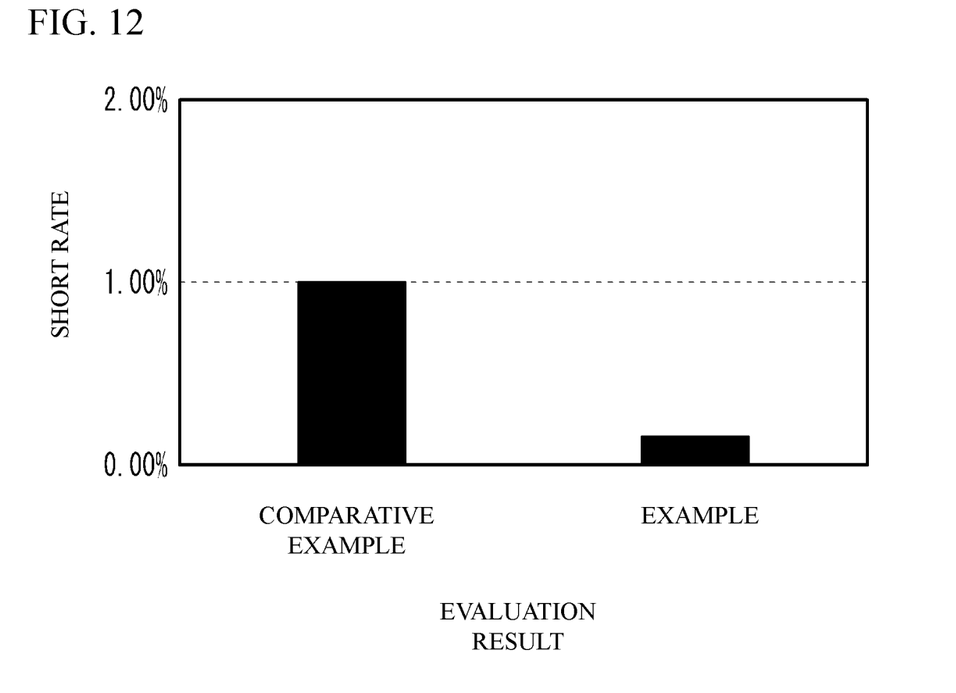
FIG. 12 illustrates a measurement result of a short rate.

FIG. 12 illustrates the results of the measurement. As illustrated in FIG. 12, the short rate of the comparative example was 1.0%. It is thought that this was because the dummy electrode was not provided in the center of the lower face 40b, and the three-point bending was not suppressed. On the other hand, the short rate of the example was 0.17%. It is thought that this was because the dummy electrode 30b was provided in the center of the lower face 40b, and the three-point bending was suppressed.

Although the embodiments of the present invention have been described in detail, it is to be understood that the various change, substitutions, and alterations could be made hereto without departing from the spirit and scope of the invention.

What is claimed is:

1. A ceramic electronic device comprising:
   a multilayer chip having a plurality of dielectric layers and a plurality of internal electrode layers that are stacked, and having a first main face and a second main face that face each other in a stacking direction and have a rectangular shape in a planar view;
   a plurality of external electrodes each of which extends from the first main face to the second main face at each of two diagonal corners of the rectangular shape, the plurality of external electrodes being spaced from each other, each of the plurality of external electrodes being connected to a part of the plurality of internal electrode layers; and
   a first conductor that is provided on the first main face, a second conductor that is provided on the second main face, the first and second conductors being spaced from the plurality of external electrodes, each of the first and second conductors being provided in a region which includes an intersection point of perpendicular bisectors of two adjacent sides of the rectangular shape,
   wherein each of the external electrodes has a triangle shape in the planar view viewed along the stacking direction,
   the first conductor and the second conductor are spaced apart and electrically insulated from each other, and
   when the adjacent two sides are referred to as a first side and a second side, the first conductor is located within 0.25 times to 0.35 times of the first side in a direction of the first side and the second conductor is located within 0.25 times to 0.35 times of the second side in a direction of the second side.

2. The ceramic electronic device as claimed in claim 1, wherein each of the first and second conductors is a dummy electrode that is not connected to any of the plurality of internal electrode layers.

3. The ceramic electronic device as claimed in claim 1, wherein each of the first and second conductors is connected to a part of the plurality of internal electrode layers.

4. The ceramic electronic device as claimed in claim 1, wherein a height of the ceramic electronic device in a stacking direction is 150 μm or less.

5. The ceramic electronic device as claimed in claim 1, wherein when the adjacent two sides are referred to as a first side and a second side, a ratio of the first side with respect to the second side is 0.90 or more and 1.10 or less.

6. The ceramic electronic device as claimed in claim 1, wherein a height of the ceramic electronic device in a stacking direction is 75 μm or less.

7. The ceramic electronic device as claimed in claim 1, wherein a height of the multilayer chip in a stacking direction is 30 μm or more and 50 μm or less.

8. A mounting substrate comprising;
   a substrate; and
   the ceramic electronic device of claim 1 and is mounted on the substrate,
   wherein each of the plurality of external electrodes and the second conductor is connected to a land provided on the substrate.

9. The ceramic electronic device as claimed in claim 1, wherein
   the first and second conductors have a same structure as the external electrodes, and
   the thickness of each of the first and second conductors is the same as the thickness of each of the external electrodes in the stacking direction.

10. The ceramic electronic device as claimed in claim 1, wherein
the internal electrode layers include a first internal electrode layer having a first extraction portion exposed to a first corner of the rectangular shape, and a second internal electrode layer having a second extraction portion exposed to a second corner different from the first corner of the rectangular shape.

11. A ceramic electronic device comprising:
a multilayer chip having a plurality of dielectric layers and a plurality of internal electrode layers that are stacked, and having a first main face and a second main face that face each other in a stacking direction and have a rectangular shape in a planar view;
two external electrodes each of which extends from the first main face to the second main face at each of two diagonal corners of the rectangular shape, the two external electrodes being spaced from each other, each of the two external electrodes being connected to a part of the plurality of internal electrode layers; and
a first conductor that is provided on the first main face, the second main face or both of the first main face and the second main face, is spaced from the two external electrodes, and is provided in a region which includes an intersection point of perpendicular bisectors of two adjacent sides of the rectangular shape; and
a second conductor that is provided on the second main face is spaced from the two external electrodes, and is provided in a region which includes an intersection point of perpendicular bisectors of two adjacent sides of the rectangular shape,
wherein the first conductor extends from a first corner of the rectangular shape of the first main face to a second corner diagonally arranged to the first corner of the rectangular shape of the first main face, on the first main face, wherein the second conductor extends from a first corner of the rectangular shape of the second main face to a second corner diagonally arranged to the first corner of the rectangular shape of the second main face, on the second main face, and
wherein when the adjacent two sides are referred to as a first side and a second side, the first and the second conductors are located within 0.25 times to 0.35 times of the first side in a direction of the first side and within 0.25 times to 0.35 times of the second side in a direction of the second side.

12. The ceramic electronic device as claimed in claim 11, the first conductor and the second conductor intersect when viewed along a stacking direction.

13. The ceramic electronic device as claimed in claim 11, wherein each of the first and second conductors is connected to a part of the plurality of internal electrode layers.

14. The ceramic electronic device as claimed in claim 11, wherein a height of the ceramic electronic device in a stacking direction is 150 µm or less.

15. The ceramic electronic device as claimed in claim 11, wherein when the adjacent two sides are referred to as a first side and a second side, a ratio of the first side with respect to the second side is 0.90 or more and 1.10 or less.

16. The ceramic electronic device as claimed in claim 11, wherein
the first and second conductors have a same structure as the external electrodes, and
the thickness of each of the first and second conductors is the same as the thickness of each of the external electrodes in the stacking direction.

17. The ceramic electronic device as claimed in claim 11, wherein
the internal electrode layers include a first internal electrode layer having a first extraction portion exposed to a first corner of the rectangular shape, and a second internal electrode layer having a second extraction portion exposed to a second corner different from the first corner of the rectangular shape.

* * * * *